US009328198B2

(12) United States Patent
Nakasugi et al.

(10) Patent No.: US 9,328,198 B2
(45) Date of Patent: May 3, 2016

(54) COMPOSITION FOR FORMING RESIST UNDERLAYER

(71) Applicant: AZ ELECTRONIC MATERIALS (LUXEMBOURG) S.A.R.L., Luxembourg (LU)

(72) Inventors: Shigemasa Nakasugi, Shizuoka (JP); Masato Suzuki, Shizuoka (JP); Jin Li, Shizuoka (JP); Motoki Misumi, Shizuoka (JP); Yasuaki Ide, Shizuoka (JP)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 14/514,728

(22) Filed: Oct. 15, 2014

(65) Prior Publication Data

US 2015/0118624 A1    Apr. 30, 2015

(30) Foreign Application Priority Data

Oct. 24, 2013    (JP) .................................. 2013-221111

(51) Int. Cl.
| | | |
|---|---|---|
| *G03F 7/11* | (2006.01) | |
| *C08G 69/44* | (2006.01) | |
| *G03F 7/30* | (2006.01) | |
| *H01L 21/027* | (2006.01) | |
| *G03F 7/20* | (2006.01) | |
| *C09D 177/10* | (2006.01) | |
| *C08G 69/12* | (2006.01) | |
| *C08G 69/48* | (2006.01) | |

(52) U.S. Cl.
CPC ................ *C08G 69/44* (2013.01); *C08G 69/12* (2013.01); *C08G 69/48* (2013.01); *C09D 177/10* (2013.01); *G03F 7/11* (2013.01); *G03F 7/20* (2013.01); *G03F 7/30* (2013.01); *H01L 21/0274* (2013.01)

(58) Field of Classification Search
CPC .............. G03F 7/11; G03F 7/30; G03F 7/20; C08G 69/12; C08G 69/44; C08G 69/48; C09D 177/10; H01L 21/0274
USPC ........... 430/271.1, 270.1, 322, 325, 329, 330, 430/331, 434, 942, 927, 913; 524/759; 560/48
See application file for complete search history.

(56) References Cited

U.S. PATENT DOCUMENTS

| | | | |
|---|---|---|---|
| 6,255,444 B1 * | 7/2001 | Yuasa et al. ................. | 528/308.6 |
| 7,101,937 B1 * | 9/2006 | Frechet et al. ................ | 525/258 |
| 7,745,540 B2 * | 6/2010 | Devadoss et al. .......... | 525/326.1 |
| 7,754,818 B2 * | 7/2010 | Devadoss et al. .......... | 525/326.1 |
| 7,928,430 B2 * | 4/2011 | Yang et al. ....................... | 257/40 |
| 8,039,202 B2 | 10/2011 | Sui et al. | |
| 8,247,498 B2 * | 8/2012 | Niitani .......................... | 525/242 |
| 8,728,631 B2 * | 5/2014 | Kitano et al. ................. | 428/680 |
| 2008/0020043 A1 * | 1/2008 | Gingras et al. ................ | 424/486 |
| 2009/0118436 A1 * | 5/2009 | Niitani ........................ | 525/390 |
| 2010/0233632 A1 * | 9/2010 | Kawazu et al. ............... | 430/323 |
| 2010/0278750 A1 * | 11/2010 | Krippner et al. ............. | 424/9.34 |
| 2012/0238699 A1 * | 9/2012 | Herz et al. .................... | 524/606 |
| 2012/0251955 A1 | 10/2012 | Sakamoto et al. | |
| 2014/0231775 A1 * | 8/2014 | Kitano et al. ................... | 257/40 |

FOREIGN PATENT DOCUMENTS

| | | | |
|---|---|---|---|
| EP | 1006101 A1 * | 6/2000 | |
| JP | 11060973 A * | 3/1999 | |
| JP | 2003238493 A * | 8/2003 | |
| JP | 2003238495 A * | 8/2003 | |
| JP | 2004323562 A * | 11/2004 | |
| JP | 2007211207 A * | 8/2007 | |
| JP | 2008-501985 A | 1/2008 | |
| JP | 2013191448 A * | 9/2013 | |
| WO | WO 2011-074494 A1 | 6/2011 | |
| WO | WO 2012-017790 A1 | 9/2012 | |

OTHER PUBLICATIONS

Translation of JP 2011-237477 (no date).*
Machine Language English Abstract from Espacenet of WO 2012/017790 A1.
Craig Higgins et al., Coefficient of Thermal Expansion (CTE) in EUV Lithography: LER and Adhesion Improvement:, SPIE vol. 7972, pp. 797211-1-pp. 797211-12 (2011).

* cited by examiner

Primary Examiner — Amanda C Walke
(74) Attorney, Agent, or Firm — Mitchell Brustein

(57) ABSTRACT

The present invention provides a dendrimer compound capable of improving critical dimension uniformity and DOF (depth of focus) margin, and also provides a composition capable of forming an underlayer film. The dendrimer compound comprises a branched chain having a central aromatic skeleton and amide or ester bond, and is contained in the composition for forming an underlayer film.

5 Claims, No Drawings

COMPOSITION FOR FORMING RESIST UNDERLAYER

This application is a United States Patent Application which claims priority to Japanese Patent Application No. 2013-221111, filed Oct. 24, 2013, the contents of which is being incorporated herein by reference.

FIELD

The present invention relates to a composition for forming resist underlayer for an electron beam or EUV lithography which is used in EUV lithographic processes for manufacturing devices and which is enough effective in reducing unfavorable effects of the electron beams or EUV so as to obtain excellent resist patterns. This invention also relates to a resist pattern formation method employing the above composition for forming resist underlayer for said lithography.

BACKGROUND

In manufacturing semiconductor devices, microfabrication is generally carried out according to lithography techniques by use of photoresist. The process of microfabrication comprises the steps of: forming a thin photoresist layer on a semiconductor substrate such as a silicon wafer, exposing the layer to active rays such as UV light through a mask pattern corresponding to the aimed device pattern, developing the exposed layer to obtain a photoresist pattern, and then etching the substrate by use of the obtained photoresist pattern as a protective film so as to form a fine relief or intaglio pattern corresponding to the above pattern on the substrate surface. In this technological field, integration degree of the devices has been increased lately and accordingly there has been a tendency of adopting very short-wavelength light, such as, KrF excimer laser (wavelength: 248 nm), ArF excimer laser (wavelength: 193 nm), extreme ultraviolet light (EUV, wavelength: 13.5 nm) or electron beams (EB), as the active rays in the exposure step. However, in the photolithographic process, the substrate may reflect light to generate standing waves and/or the exposure light may be reflected diffusely by bumps of the substrate. Consequently, the process often suffers from a problem in that dimension accuracy of the pattern is lowered. Further, when very short-wavelength light such as EUV is employed as the exposure light, the resist layer may be adversely affected by gases given off from the substrate placed thereunder. In order to solve this problem, it is widely studied to form a bottom anti-reflective coating between the substrate and the photoresist. The bottom anti-reflective coating is required to have various properties. For example, it is preferred for the bottom anti-reflective coating to largely absorb radiation used for exposure of the photoresist, to prevent diffused reflection and the like so that the exposed and developed photoresist can have a cross section perpendicular to the substrate surface, and to be insoluble in solvents contained in the photoresist composition (namely, not to cause intermixing). The intermixing is particularly serious because it often gives adverse effects to the interface between the photoresist layer and the bottom anti-reflective coating. Accordingly, the intermixing may make it difficult to control the pattern or shape of the photoresist.

Lithography techniques with electron beams or EUV (wavelength: 13.5 nm) have been receiving a lot of attention for these years. However, even if the lithography techniques with electron beams or EUV is adopted in a device-manufacturing process, a resist pattern having an undercut or skirt shape is formed but it is impossible to form a resist pattern having a favorable rectangular shape. That is because the electron beams, EUV or the underlying substrate adversely affects formation of the resist pattern. The unfavorable pattern shape is liable to cause various problems, such as, increases of pattern sidewall roughness (line edge roughness, LER) and line width roughness (LWR), such insufficient adhesion between the resist pattern and the substrate as to cause pattern collapse, shallow depth of focus, low sensitivity, and low etching rate. Accordingly, in the electron beam- or EUV-lithographic process, it is necessary to replace a conventional anti-reflective resist underlayer film (i.e., anti-reflective coating) with an electron beam or EUV lithography-oriented resist underlayer film capable of reducing adverse effects of the electron beams or EUV and thereby of making it possible to form a favorable resist pattern.

In Non-patent document 1, polymers having low thermal expansion coefficients are employed to improve pattern collapse and LWR. Also as described in Patent documents 1 to 3, conventional electron beam or EUV lithography-oriented resist underlayer films are mainly made of polymers. Those polymers used in prior arts have large molecular weight distributions, and hence the formed underlayer films are thought to be largely inhomogeneous in inner density. Accordingly, since it is difficult to form a uniform film serving as the underlayer film, the formed film often suffers from collapse of resist pattern and is not homogeneously affected by adverse effects of the electron beams, EUV and/or the underlying substrate. Thus, it cannot be said that those prior arts fully improve LWR.

[Patent document 1] Japanese Translation of PCT International Application Publication No. 2008-501985
[Patent document 2] International Patent Publication No. 2011/074494
[Patent document 3] International Patent Publication No. 2012/017790
[Non-patent document 1] Proc. SPIE, Vol. 7972, 797211(2011)

DETAILED DESCRIPTION

In view of the above, the present invention aims to provide a compound that can be used in an underlayer film so as to improve sensitivity, exposure latitude, depth of focus, LWR, and etching durability. Further, this invention also aims to provide a composition capable of forming an underlayer film improved in those characteristics.

The present invention provides a dendrimer compound represented by the following formula (1):

$$Ar^1(\!-\!\!Z^1)_{m1-k1}(\text{-L}^1\text{'}_{p1}\text{-L}^{1\text{'}}\text{-L}^{1\text{'}}_{p1}\text{-A})_{k1} \qquad (1)$$

in which $Ar^1$ is an aromatic skeleton selected from the group consisting of benzene skeleton, naphthalene skeleton and anthracene skeleton;

each $Z^1$ is hydrogen, a hydrocarbon group of 1 to 3 carbon atoms or a halogen provided that the plural $Z^1$s may be the same or different from each other;

each $L^1$ is amide bond or ester bond provided that the plural $L^1$s may be the same or different from each other;

each $L^{1\prime}$ is a divalent linking group selected from the group consisting of a hydrocarbon chain having 1 to 3 carbon atoms, an oxygen-containing hydrocarbon chain having 1 to 3 carbon atoms, and a sulfur-containing hydrocarbon chain having 1 to 3 carbon atoms, and may be a straight chain or a branched chain provided that the plural $L^{1\prime}$s may be the same or different from each other;

m1 is 6 if $Ar^1$ is benzene skeleton, 8 if $Ar^1$ is naphthalene skeleton or 10 if $Ar^1$ is anthracene skeleton;

k1 is a number of 2 or more but not more than m1;

each p1 is 0 or 1 provided that the plural p1s may be the same or different from each other; and A is a group represented by the following formula (2):

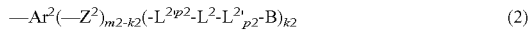
$$—Ar^2(—Z^2)_{m2-k2}(-L^{2\prime}_{p2}-L^2-L^{2\prime}_{p2}-B)_{k2} \qquad (2)$$

in which $Ar^2$ is an aromatic skeleton selected from the group consisting of benzene skeleton, naphthalene skeleton and anthracene skeleton;

each $Z^2$ is hydrogen, a hydrocarbon group of 1 to 3 carbon atoms or a halogen provided that the plural $Z^2$s may be the same or different from each other;

each $L^2$ is amide bond or ester bond provided that the plural $L^2$s may be the same or different from each other;

each $L^{2\prime}$ is a divalent linking group selected from the group consisting of a hydrocarbon chain having 1 to 4 carbon atoms, an oxygen-containing hydrocarbon chain having 1 to 4 carbon atoms, and a sulfur-containing hydrocarbon chain having 1 to 4 carbon atoms, and may be a straight chain or a branched chain provided that the plural $L^{2\prime}$s may be the same or different from each other;

m2 is 5 if $Ar^2$ is benzene skeleton, 7 if $Ar^2$ is naphthalene skeleton or 9 if $Ar^2$ is anthracene skeleton;

k2 is a number of 1 or more but not more than m2;

each p2 is 0 or 1 provided that the plural p2s may be the same or different from each other; and B is a group represented by the above formula (2) or by the following formula (3A) or (3B):

$$—Ar^3(—Z^3)_{m3} \qquad (3A)$$

$$—R^3 \qquad (3B)$$

in which $Ar^3$ is an aromatic skeleton selected from the group consisting of benzene skeleton, naphthalene skeleton and anthracene skeleton;

each $Z^3$ is a group selected from the group consisting of hydrogen, a hydrocarbon group of 1 to 4 carbon atoms, a halogen, carboxyl group and ester group, provided that the plural $Z^3$s may be the same or different from each other;

m3 is 5 if $Ar^3$ is benzene skeleton, 7 if $Ar^3$ is naphthalene skeleton or 9 if $Ar^3$ is anthracene skeleton; and $R^3$ is a hydrocarbon group of 1 to 4 carbon atoms which may be substituted with a halogen.

Further, the present invention also provides a composition for forming underlayer film comprising the above dendrimer compound, a crosslinking agent, a thermal acid generating agent, and a solvent.

The present invention still also provides an underlayer film formed by coating on a substrate and then heating said composition for forming resist underlayer film.

The present invention furthermore provides a pattern formation method comprising the steps of coating on a semiconductor substrate and then baking said composition for forming resist underlayer film, to form an underlayer film, forming a photoresist layer on said underlayer film, exposing to light said semiconductor substrate covered with said underlayer film and said photoresist layer, and developing said exposed photoresist layer with a developer.

If used in a composition for forming resist underlayer film, the dendrimer compound provided by the present invention can show excellent characteristics. The composition for forming resist underlayer film according to an embodiment of the present invention hardly causes intermixing between the underlayer film and the resist composition layer in forming a pattern, and hence enables to form a resist pattern having a cross section perpendicular to the substrate surface and also enables to improve sensitivity, exposure latitude, depth of focus, LWR, and etching durability. Further, the underlayer film formed from the composition of the present invention is characterized by having a small thermal expansion coefficient, and therefore the surface thereof can be kept from deterioration of smoothness caused by thermal expansion even if heated. In addition, since the dendrimer compound used in the composition has a relatively small molecular weight, it is possible to increase density of the underlayer film and also to realize excellent homogeneity of the film-density.

Embodiments of the present invention will now be explained below in detail.

<Dendrimer Compound>

The dendrimer compound according to the present invention is represented by the following formula (1):

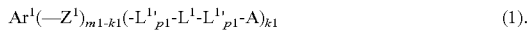
$$Ar^1(—Z^1)_{m1-k1}(-L^{1\prime}_{p1}-L^1-L^{1\prime}_{p1}-A)_{k1} \qquad (1).$$

In the formula (1), $Ar^1$ is an aromatic skeleton selected from the group consisting of benzene skeleton, naphthalene skeleton and anthracene skeleton;

each $Z^1$ is hydrogen, a hydrocarbon group of 1 to 3 carbon atoms or a halogen provided that the plural $Z^1$s may be the same or different from each other;

each $L^1$ is amide bond or ester bond provided that the plural $L^1$s may be the same or different from each other;

each $L^{1\prime}$ is a divalent linking group selected from the group consisting of a hydrocarbon chain having 1 to 3 carbon atoms, an oxygen-containing hydrocarbon chain having 1 to 3 carbon atoms, and a sulfur-containing hydrocarbon chain having 1 to 3 carbon atoms, and may be a straight chain or a branched chain provided that the plural $L^{1\prime}$s may be the same or different from each other;

m1 is 6 if $Ar^1$ is benzene skeleton, 8 if $Ar^1$ is naphthalene skeleton or 10 if $Ar^1$ is anthracene skeleton;

k1 is a number of 2 or more but not more than m1; and each p1 is 0 or 1 provided that the plural p1s may be the same or different from each other.

In the formula (1), $Ar^1$ is an aromatic skeleton having one to three benzene rings. Examples of the aromatic skeleton include benzene skeleton, naphthalene skeleton and anthracene skeleton. In consideration of accelerating the etching rate, the dendrimer compound of the present invention preferably has benzene skeleton. The above aromatic skeletons are different in how many substituents they have, and the number of the substituents corresponds to m1 in the formula (1). Specifically, m1 is 6 if $Ar^1$ is benzene skeleton, 8 if $Ar^1$ is naphthalene skeleton or 10 if $Ar^1$ is anthracene skeleton.

Each $Z^1$ may be any one of hydrogen, hydrocarbon group of 1 to 3 carbon atoms and halogen. Preferred examples of the halogen include fluorine, chlorine, bromine and iodine. In consideration of improving the sensitivity, fluorine or iodine is particularly preferred.

The $(-L^{1\prime}_{p1}-L^1-L^{1\prime}_{p1}-A)$ group in the formula (1) is a relatively large substituent and k1 is 2 or more, and therefore the compound of the formula (1) can have a dendrimer structure. If k1 is too large, it may be difficult to synthesize the compound because of steric hindrance. Accordingly, the number of the $(-L^{1\prime}_{p1}-L^1-L^{1\prime}_{p1}-A)$ groups is not always preferred to be the maximum, namely, m1. Specifically, k1 is preferably 3 if $Ar^1$ is benzene skeleton, but preferably 4 if $Ar^1$ is naphthalene skeleton or anthracene skeleton. Those $(-L^{1\prime}_{p1}-L^{1}-L^{1\prime}_{p1}-A)$ groups are preferably symmetrically linked to the central aromatic skeleton.

Each $L^1$ is amide bond —CONH— or ester bond —COO—. The $L^1$ groups may connect to the adjacent groups directly or via the divalent linking groups $L^{1\prime}$ having 1 to 3 carbon atoms. If $L^1$ directly connects to the adjacent group, p1 in the formula (1) is 0. Every p1 is preferably 0. This means that $Ar^1$ and A are preferably combined with each other only via amide or ester bond. Thus, the linking group via which $Ar^1$ and A are combined contains amide or ester bond, and thereby the formed underlayer film can be improved in etching rate and can have a low thermal expansion coefficient. In fact, if a linking group having neither amide nor ester bond is used, it is difficult to realize a sufficient etching rate and also the thermal expansion coefficient is liable to increase.

Each $L^{1\prime}$ is a divalent linking group. This linking group is selected from the group consisting of a hydrocarbon chain having 1 to 3 carbon atoms, an oxygen-containing hydrocarbon chain having 1 to 3 carbon atoms, and a sulfur-containing hydrocarbon chain having 1 to 3 carbon atoms. Here, the term of "oxygen-containing hydrocarbon chain" or "sulfur-containing hydrocarbon chain" means a hydrocarbon chain having a substituent such as hydroxide or thiol in the side chain or containing ether or thioether bond in the main chain. The ether or thioether bond may be either randomly or regularly contained in the main chain. Further, $L^{1\prime}$ may be a straight chain or a branched chain. Concrete examples thereof include —CH$_2$—, —(CH$_2$)$_2$—, —(CH$_2$)$_3$—, —CH$_2$—CH(CH$_3$)—, —CH$_2$—O—CH$_2$—, and —CH$_2$—S—CH$_2$—.

In the formula (1), A is a group represented by the following formula (2):

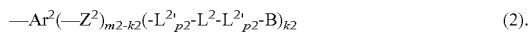

$$-Ar^2(-Z^2)_{m2-k2}(-L^{2\prime}_{p2}-L^2-L^{2\prime}_{p2}-B)_{k2} \quad (2).$$

In the formula (2), $Ar^2$ is an aromatic skeleton selected from the group consisting of benzene skeleton, naphthalene skeleton and anthracene skeleton.

Each $Z^2$ connecting to $Ar^2$ is hydrogen, a hydrocarbon group of 1 to 3 carbon atoms or a halogen, and the plural $Z^2$s may be the same or different from each other. Preferred examples of the halogen include fluorine, chlorine, bromine and iodine. In consideration of improving the sensitivity, fluorine or iodine is particularly preferred.

Each $L^2$ is amide bond or ester bond, and the plural $L^2$s may be the same or different from each other.

Each $L^{2\prime}$ is a divalent linking group. This linking group is selected from the group consisting of a hydrocarbon chain having 1 to 4 carbon atoms, an oxygen-containing hydrocarbon chain having 1 to 4 carbon atoms, and a sulfur-containing hydrocarbon chain having 1 to 4 carbon atoms. If ether or thioether bond is contained in the main chain of $L^{2\prime}$, it may be positioned either randomly or regularly. Further, $L^{2\prime}$ may contain a substituent such as hydroxide or thiol in the side chain. Each $L^{2\prime}$ may be a straight chain or a branched chain. If $L^2$ directly connects to the adjacent group, p2 in the formula (2) is 0. Concrete examples thereof include —CH$_2$—, —(CH$_2$)$_2$—, —(CH$_2$)$_3$—, —CH$_2$—CH(CH$_3$)—, —CH$_2$—CH(OH)—, —CH(CH$_2$OH)—, and —CH$_2$—CH(SH)—.

In the case, m2 is 5 if $Ar^2$ is benzene skeleton, 7 if $Ar^2$ is naphthalene skeleton or 9 if $Ar^2$ is anthracene skeleton.

Further, k2 is a number of 1 or more but not more than m2. If k2 is 2 or more, the group A represented by the formula (2) can have a more branched chain structure. The compound of the formula (1) needs to have a branched chain structure in order to exhibit excellent effects when used in the composition for forming resist underlayer film of the present invention. However, if the structure is too much branched, the desired effects often cannot be obtained because of steric hindrance or the like. Accordingly, k2 is preferably 3 or less, more preferably 2.

In the formula (2), B is a group represented by the above formula (2) or by the following formula (3A) or (3B):

$$-Ar^3(-Z^3)_{m3} \quad (3A)$$

$$-R^3 \quad (3B).$$

In the above, $Ar^3$ is an aromatic skeleton selected from the group consisting of benzene skeleton, naphthalene skeleton and anthracene skeleton.

Each $Z^3$ is a group selected from the group consisting of hydrogen, a hydrocarbon group of 1 to 4 carbon atoms, particularly an alkyl group, a halogen, carboxyl group and ester group, and the plural $Z^3$s may be the same or different from each other In the case, m3 is 5 if $Ar^3$ is benzene skeleton, 7 if $Ar^3$ is naphthalene skeleton or 9 if $Ar^3$ is anthracene skeleton.

Further, $R^3$ is a hydrocarbon group of 1 to 4 carbon atoms. This hydrocarbon group may be substituted with a halogen. The halogens in $Z^3$ and $R^3$ are preferably selected from the group consisting of fluorine, chlorine, bromine and iodine. In consideration of improving the sensitivity, fluorine or iodine is particularly preferred.

The dendrimer compound of the present invention may be what is called a high-generation dendrimer compound which repeatedly contains the substituents represented by the formula (2). However, if the generation is too high, the dendrimer compound tends to be poor in exposure latitude and depth of focus. Accordingly, the number of generation is preferably 10 or less. Further, if the dendrimer compound has a relatively small molecular weight, the formed underlayer film is often improved in evenness, film-density and thermal expansion coefficient. The number of generation is, therefore, more preferably 6 or less, further preferably 4 or less.

<Composition for Forming Resist Underlayer Film>

In addition to the above dendrimer compound, the composition for forming resist underlayer film according the present invention comprises a crosslinking agent, a thermal acid generating agent, and a solvent. Further, according to necessity, the composition may further contain other additives, such as, photo-acid generating agents and surfactants. Those components will be described below.

Crosslinking Agent

The composition for forming resist underlayer film according to the present invention contains a crosslinking agent. The crosslinking agent is incorporated in the composition for the purpose of preventing intermixing between the underlayer film to be formed and the upper layer, such as a resist layer, provided thereon. Any compound can be adopted as the crosslinking agent as long as it acts on the terminal hydroxyl groups of the dendrimer compound to form a crosslinking structure when exposed to light. Concrete examples of the crosslinking agent include hexamethyl melamine, hexamethoxymethyl melamine, 1,2-dihydroxy-N,N'-methoxymethyl succinimide, 1,2-dimethoxy-N,N'-methoxymethyl succinimide, 1,3,4,6-tetrakis(methoxymethyl)glycoluril, tetramethoxymethyl glycoluril, N,N'-methoxymethyl urea, and hexakis(methoxymethyl)-1,3,5-triazine-2,4,6-triamine. Among them, compounds having the functional groups of N—CH$_2$—O—CH$_3$ are preferred because they can exhibit strong effects as the crosslinking agents.

Thermal Acid Generating Agent

The composition for forming resist underlayer film according to the present invention contains a thermal acid generating agent, which promotes crosslinking in the underlayer film to be formed. Concrete examples of the thermal acid generating agent used in the composition of the present invention include: various aliphatic sulfonic acids and salts thereof; various aliphatic carboxylic acids, such as, citric acid, acetic acid and maleic acid, and salts thereof; various aromatic carboxylic acids, such as, benzoic acid and phthalic acid, and salts thereof; aromatic sulfonic acids and ammonium salts thereof; various amine salts; aromatic diazonium salts; phosphonic acids and salts thereof; and other salts and esters capable of generating organic acids. As the thermal acid generating agent, a salt formed by an organic acid and an organic base is preferably used in the present invention. Among them, carboxylic acids and salts thereof and sulfonic acids and salts thereof are particularly preferred, and sulfonic acids and salts thereof are further preferred because they remarkably show the effect of the present invention. In addition, carboxylic acids and salts thereof are preferred also because they give excellent effects particularly when the underlayer film is subjected to high temperature treatment.

Preferred examples of the thermal acid generating agent containing sulfonic acid include p-toluenesulfonic acid, benzenesulfonic acid, p-dodecylbenzenesulfonic acid, 1,4-naphthalene-disulfonic acid, methanesulfonic acid, and 1,1,2,2,3,3,4,4,4-nanofluorobutane-1-sulfonic acid. Those can be used singly or in mixture with each other.

Solvent

As the solvent contained in the composition for forming resist underlayer film according the present invention, any can be selected to use as long as it can dissolve the above components. Concrete examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propyleneglycol propyl ether acetate, toluene, xylene, methyl ethyl ketone, cyclopentanone, cyclohexanone, ethyl 2-hydroxypropionate, ethyl 2-hydroxy-2-methyl propionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. Those can be used singly or in combination of two or more. Further, they also can be used in mixture with high boiling point solvents, such as, propyleneglycol monobutyl ether and propyleneglycol monobutyl ether acetate.

Photo-Acid Generating Agent

If necessary, the composition for forming resist underlayer film according to the present invention can contain a photo-acid generating agent, which is often used so as to avoid scum or footing of the resist layer formed on the underlayer film.

The photo-acid generating agent can be freely selected from the conventionally known compounds. Concrete examples of the photo-acid generating agent include onium salt compounds, crosslinkable onium salt compounds, sulfone maleimide derivatives, and disulfonyl diazomethane compounds.

Examples of the onium salt compounds include: iodonium salt compounds, such as, diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromehanesulfonate; sulfonium salt compounds, such as, triphenylsulfonium hexafluoroantimonate, triphenylsulfonium nonafluoro-n-butanesulfonate, triphenylsulfonium camphorsulfonate, and triphenylsulfonium trifluoromehanesulfonate; and crosslinkable onium salt compounds, such as, bis(4-hyroxyphenyl)-(phenyl)sulfonium trifluoromehanesulfonate, bis(4-hydroxyphenyl)(phenyl)sulfonium-1,1,2,2,3,3,4,4,4-nonafluorobutane-1-sulfonate, phenyl bis(4-(2-(vinyloxy)ethoxy)phenyl)sulfonium-1,1,2,2,3,3,4,4-octaflorobutane-1,4-disulfonate, and tris(4-(2-(vinyloxy)ethoxy)phenyl)sulfonium-1,1,2,2,3,3,4,4-octaflorobutane-1,4-disulfonate. However, those examples by no means restrict the photo-acid generating agent.

Examples of the sulfone maleimide derivatives include N-(trifluoromethanesulfonyloxy)succinimide, N-(nonafluoro-n-butanesulfonyloxy)succinimide, N-(camphorsulfonyloxy)-succinimide, and N-(trifluoromethanesulfonyloxy)naphthalimide.

Examples of the disulfonyl diazomethane compounds include bis(trifluoromethylsulfonyl)diazomethane, bis(cyclo-hexylsulfonyl)diazomethane, bis(phenylsulfonyl)diazomethane, bis(p-toluenesulfonyl)diazomethane, bis(2,4-dimethylbenzene-sulfonyl)diazomethane, and methylsulfonyl-p-toluenesulfonyl diazomethane. In the composition for forming resist underlayer film according to the present invention, those photo-acid generating agents can be used in combination of two or more.

Other Components

According to necessity, the composition for forming resist underlayer film according to the present invention can contain other components, such as, surfactants and smoothing agents. Those components should be used as long as they do not impair the effect of the invention.

Pattern Formation Method

The composition for forming resist underlayer film according to the present invention can be used in the same manner as a conventional film-forming composition. This means that an underlayer film can be formed by coating on a desired substrate and then heating the composition of the present invention. The formed underlayer film can be employed in a photolithographic pattern formation process without the need for any special modification. Specifically, the pattern formation method adopting the above composition for forming resist underlayer film comprises the steps of coating on a semiconductor substrate and then baking said composition for forming resist underlayer film, to form an underlayer film, forming a photoresist layer on said underlayer film, exposing to light said semiconductor substrate covered with said underlayer film and said photoresist layer, and developing said exposed photoresist layer with a developer.

Consequently, the underlayer film formed from the composition of the present invention is bared in the area where the photoresist is removed by the development. Since having a larger etching rate than the photoresist, the underlayer film can be easily removed by etching. Further, the composition for forming resist underlayer film may be combined with a photo-sensitive resin or with a sensitizer so as to make the underlayer film developable.

Since formed by use of the underlayer film according to the present invention, the obtained pattern can realize the excellent characteristics described above.

The following examples will explain the present invention more concretely, but they by no means limit the scope of the present invention. In the present specification, "part(s)" and "%" in the examples mean "weight part(s)" and "weight percent", respectively, unless otherwise mentioned.

SYNTHESIS EXAMPLE 1

In a reaction vessel equipped with a stirrer and a nitrogen introduction tube, 5-aminoisophtalic acid (103 parts), N,N-dimethyl-4-aminopyridine (DMAP) (7 parts) and N,N-dimethylacetamide (DMAc) (1800 parts) were placed and stirred under a nitrogen atmosphere. Subsequently, 1,3,5-benzenetricarbonyl trichloride (50 parts) was slowly added and allowed to react for 12 hours while the reaction temperature was kept at 25° C. After the reaction was completed, the reaction solution was poured into pure water (8000 parts) to form precipitates, which was then collected by filtration and dried in vacuum at 50° C. to obtain 125 parts (95%) of Intermediate product 1.

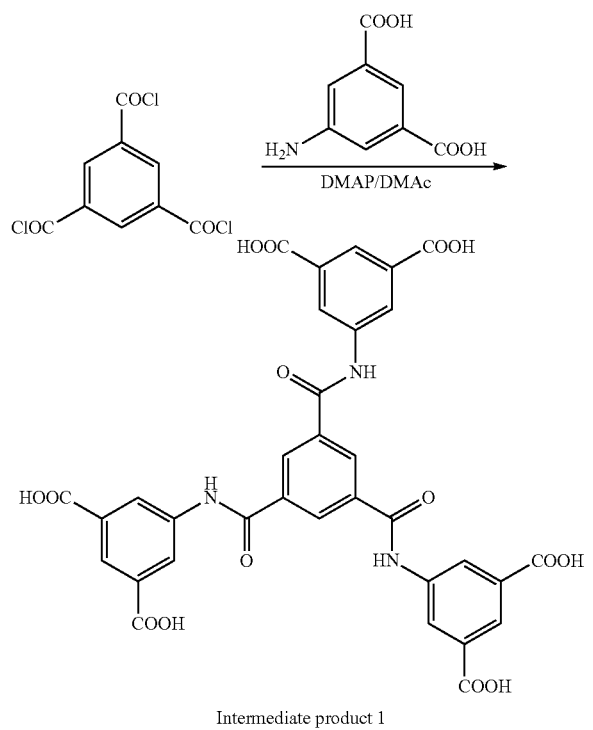

Intermediate product 1

Spectrum Data of Intermediate Product 1

$^1$H-NMR (dimethylsulfoxide, DMSO-d6): 11.00 (s, 3H, CONH), 8.85 (s, 3H, ArH), 8.73 (d, 6H, $\underline{J}$=1.2 Hz, ArH), 8.26 (t, 3H, $\underline{J}$=1.2 Hz, ArH)

SYNTHESIS EXAMPLE 2

In a reaction vessel equipped with a stirrer and a nitrogen introduction tube, 5-amino-2,4,6-triiodo-isophtalic acid (230 parts), N,N-dimethyl-4-aminopyridine (DMAP) (5 parts) and N,N-dimethylacetamide (DMAc) (400 parts) were placed and stirred under a nitrogen atmosphere. Subsequently, 1,3,5-benzenetricarbonyl trichloride (30 parts) was slowly added and allowed to react for 12 hours while the reaction temperature was kept at 25° C. After the reaction was completed, the reaction solution was poured into pure water (1800 parts) to form precipitates, which was then collected by filtration and dried in vacuum at 50° C. to obtain 150 parts (71%) of Intermediate product 2.

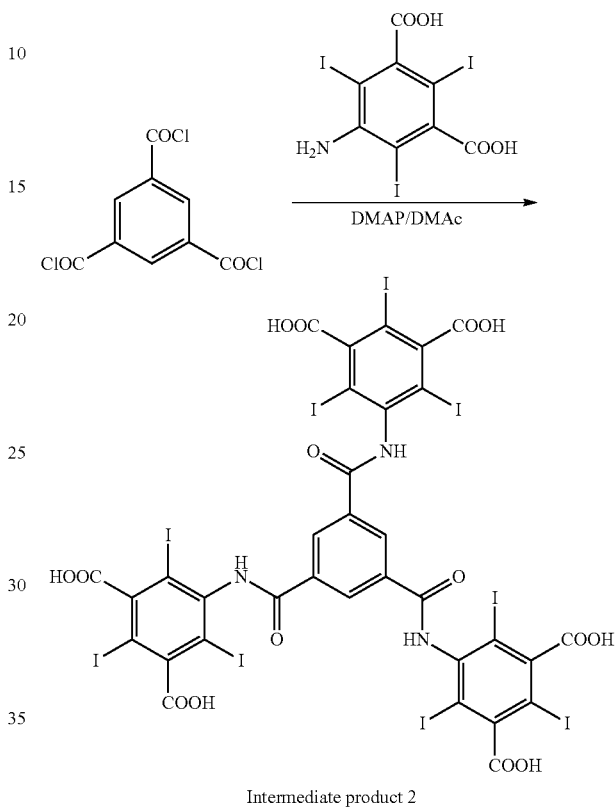

Intermediate product 2

Spectrum Data of Intermediate Product 2

$^1$H-NMR (DMSO-d6): 10.97 (s, 3H, CONH), 9.00 (s, 3H, ArH)

$^{13}$C-NMR (CDCl$_3$): 170.11, 164.17, 150.10, 143.75, 135.23, 130.95, 98.52, 88.10

EXAMPLE 1

In a reaction vessel equipped with a stirrer, a condenser, a heater, a nitrogen introduction tube and a thermostat, Intermediate product 1 (100 parts), styrene oxide (155 parts), tetrabutylammonium bromide (TBAB) (12 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 130 parts of Product 1 (yield: 64%).

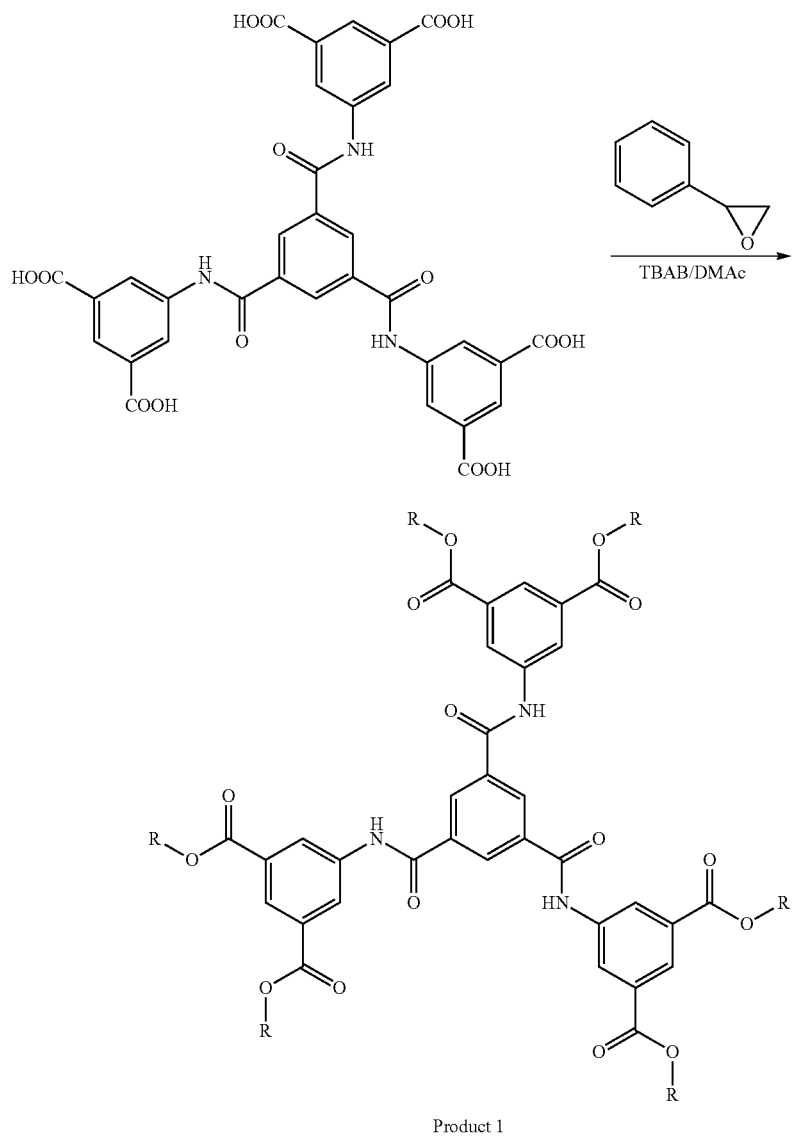

Product 1

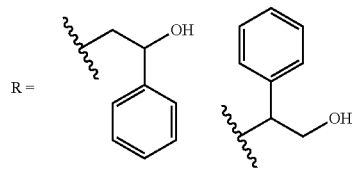

R =

Spectrum Data of Product 1

$^{1}$H-NMR (DMSO-d6): 11.14 (s, 3H, CONH), 8.86 (m, 9H, ArH), 8.37 (m, 3H, ArH), 7.37 (m, 30H, ArH), 6.06 (m, 2H, COOC$\underline{H}$Ph), 5.81-5.28 (m, 6H, OH), 5.01 (m, 5H, C$\underline{H}$OH), 4.41 (m, 8H, COOC$\underline{H}_2$CH), 3.85 (m, 3H, C$\underline{H}_2$OH)

EXAMPLE 2

In a reaction vessel equipped with a stirrer, a condenser, a heater, a nitrogen introduction tube and a thermostat, Intermediate product 1 (100 parts), 2-((2,2,3,3,3-pentafluoro-propyl)methyloxirane (265 parts), tetrabutylammonium bromide (TBAB) (12 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 174 parts of Product 2 (yield: 63%).

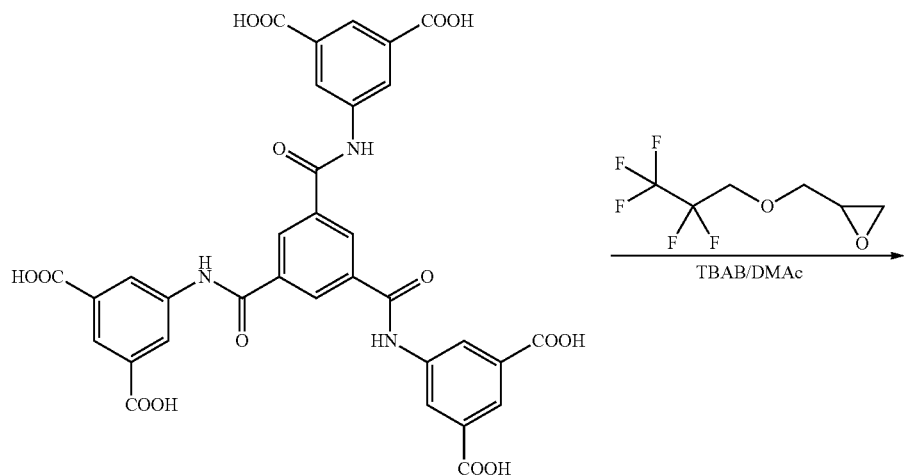
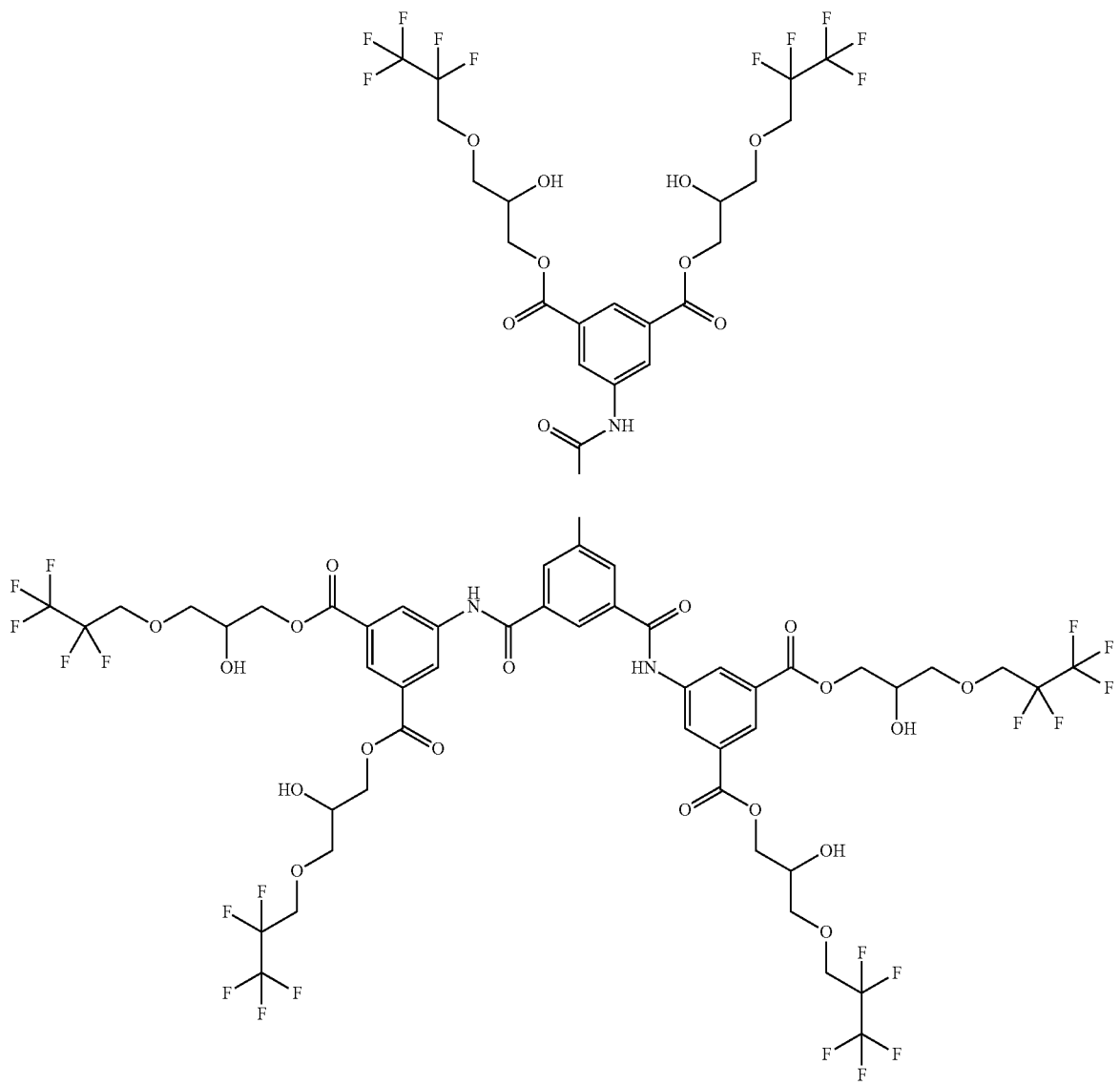
Product 2

Spectrum Data of Product 2

$^1$H-NMR (DMSO-d6): 11.09 (s, 3H, CONH), 8.87 (s, 3H, ArH), 8.79 (s, 6H, ArH), 8.32 (s, 3H, ArH), 6.51 (m, 6H, COOCH$_2$C$\underline{H}$OH), 5.36-5.07 (m, 6H, OH), 4.32 (m, 12H, CF$_3$CF$_2$C$\underline{H}_2$), 3.97 (m, 12H, COOC$\underline{H}_2$), 3.66 (m, 12H, CF$_3$CF$_2$C$\underline{H}_2$OC$\underline{H}_2$)

EXAMPLE 3

In a reaction vessel equipped with a stirrer, a condenser, a heater, a nitrogen introduction tube and a thermostat, Intermediate product 1 (100 parts), 2-((naphthalene-2-yl-methoxy)methyl)oxirane (276 parts), tetrabutylammonium bromide (TBAB) (12 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 144 parts of Product 3 (yield: 60%).

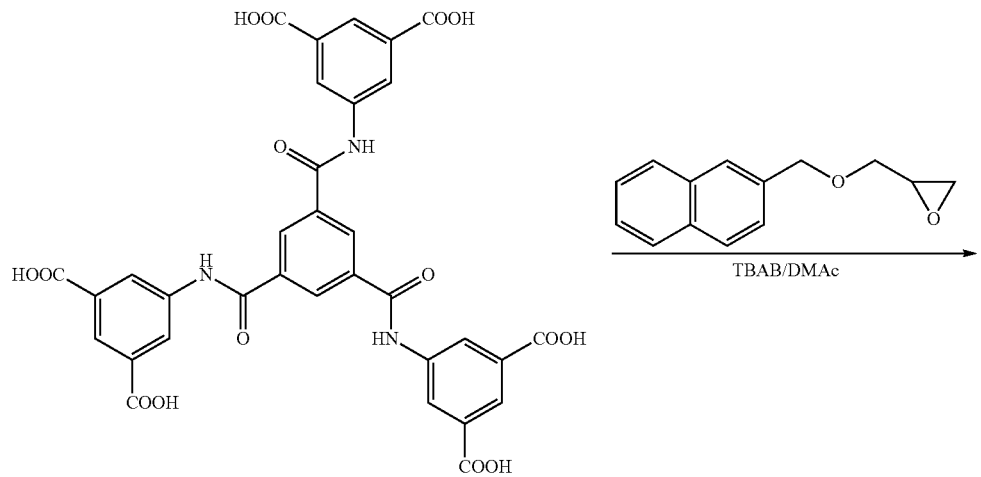

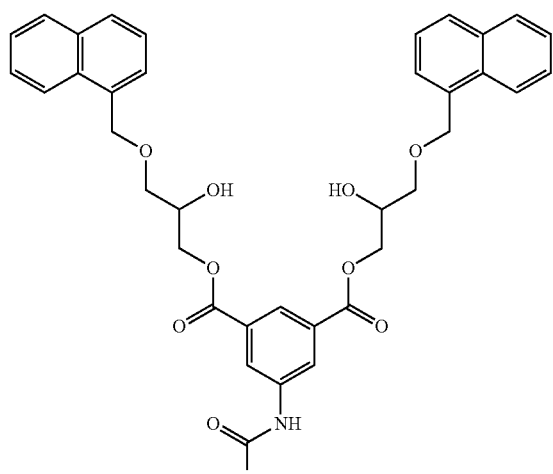

-continued

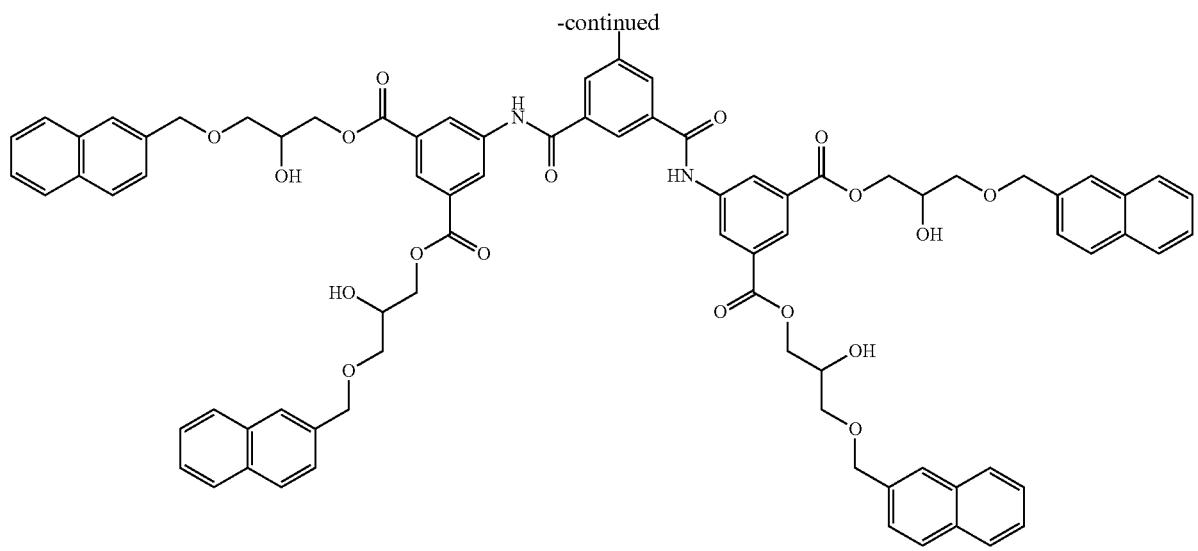

Product 3

Spectrum Data of Product 3

$^1$H-NMR (DMSO-d6): 11.09 (s, 3H, CONH), 8.87 (s, 3H, ArH), 8.79 (s, 6H, ArH), 8.32 (s, 3H, ArH), 8.02 (m, 42H, ArH), 6.51 (m, 6H, COOCH$_2$C$\underline{H}$OH), 5.36-5.07 (m, 6H, OH), 4.74 (m, 12H, ArC$\underline{H}_2$O), 3.97 (m, 12H, COOC$\underline{H}_2$)

EXAMPLE 4

In a reaction vessel equipped with a stirrer, a condenser, a heater, a nitrogen introduction tube and a thermostat, Intermediate product 1 (100 parts), 2-(4-fluorophenyl)oxirane (178 parts), tetrabutylammonium bromide (TBAB) (12 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 144 parts of Product 4 (yield: 66%).

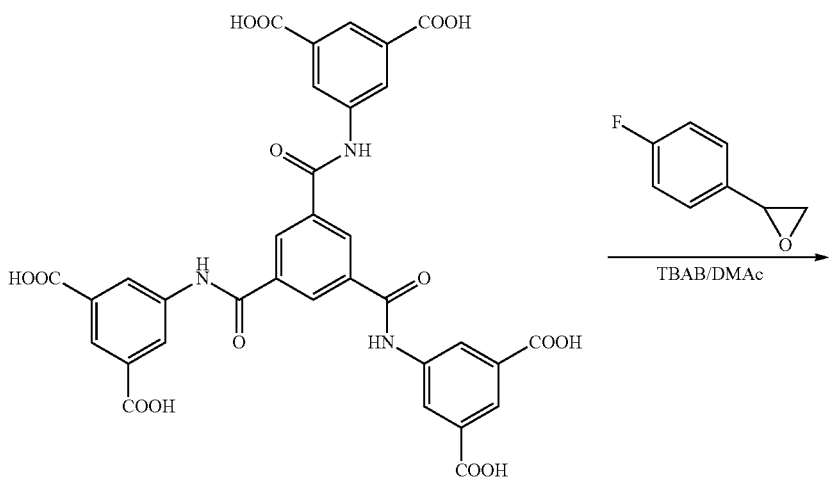

-continued

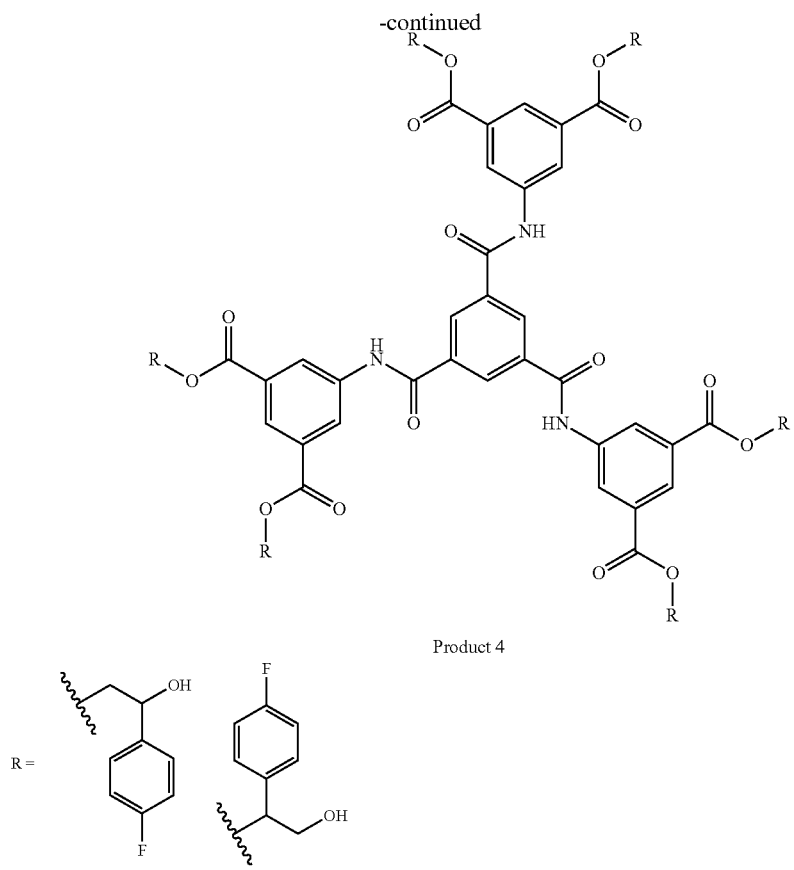

Product 4

Spectrum Data of Product 4

$^1$H-NMR (DMSO-d6): 11.13 (s, 3H, CONH), 8.84 (m, 9H, ArH), 8.35 (m, 3H, ArH), 7.34 (m, 24H, ArH), 6.06 (m, 2H, COOC$\underline{H}$Ph), 5.83-5.29 (m, 6H, OH), 5.00 (m, 5H, C$\underline{H}$OH), 4.43 (m, 8H, COOC$\underline{H}_2$CH), 3.87 (m, 3H, C$\underline{H}_2$OH)

EXAMPLE 5

In a reaction vessel equipped with a stirrer, a condenser, a heater, a nitrogen introduction tube and a thermostat, Intermediate product 1 (100 parts), 2-(4-iodophenyl)oxirane (316 parts), tetrabutylammonium bromide (TBAB) (12 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 183 parts of Product 5 (yield: 59%).

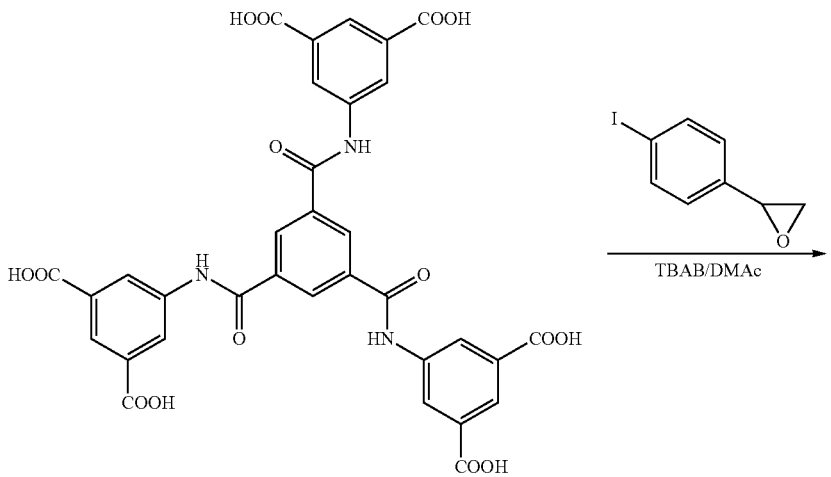

-continued

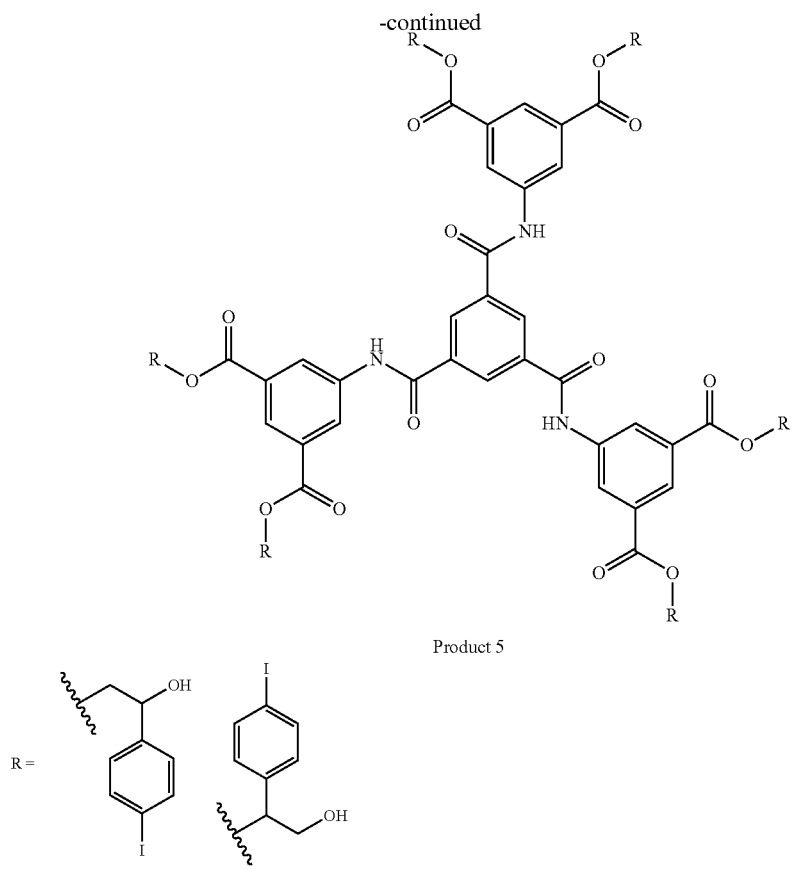

Product 5

Spectrum Data of Product 5

$^1$H-NMR (DMSO-d6): 11.13 (s, 3H, CONH), 8.84 (m, 9H, ArH), 8.35 (m, 3H, ArH), 7.34 (m, 24H, ArH), 6.01 (m, 2H, COOC$\underline{H}$Ph), 5.81-5.27 (m, 6H, OH), 4.99 (m, 5H, C$\underline{H}$OH), 4.42 (m, 8H, COOC$\underline{H}_2$CH), 3.84 (m, 3H, C$\underline{H}_2$OH)

EXAMPLE 6

In a reaction vessel equipped with a stirrer, a condenser, a heater, a nitrogen introduction tube and a thermostat, Intermediate product 2 (100 parts), styrene oxide (59 parts), tetrabutylammonium bromide (TBAB) (5 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 85 parts of Product 6 (yield: 61%).

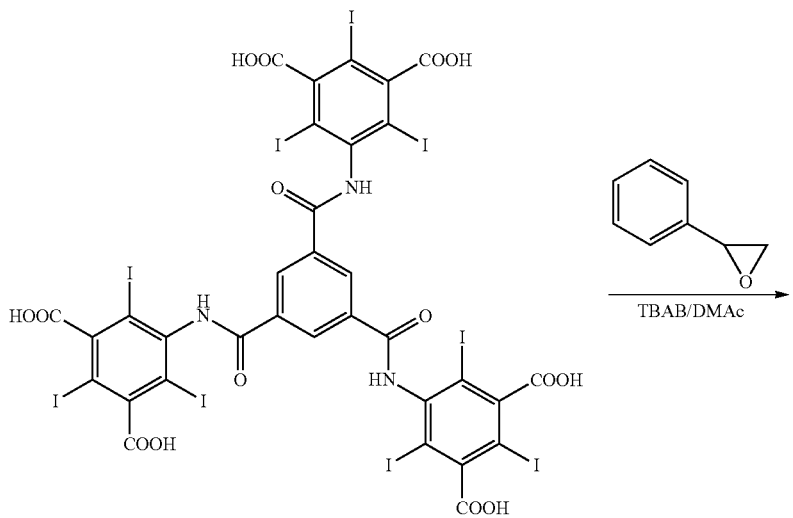

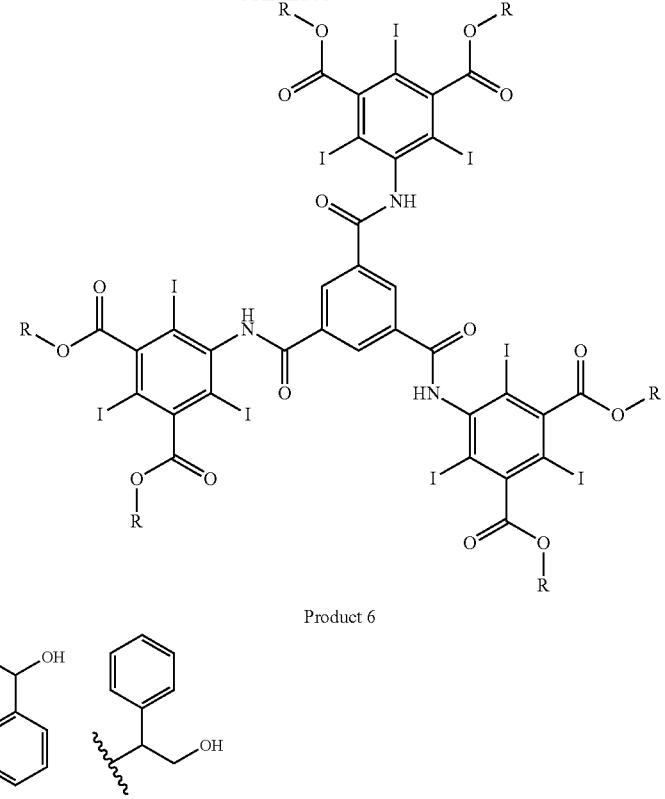

Product 6

Spectrum Data of Product 6

$^1$H-NMR (DMSO-d6): 11.06 (s, 3H, CONH), 8.98 (m, 3H, ArH), 7.42 (m, 30H, ArH), 5.88 (m, 5H, COOCH$_2$C$\underline{H}$Ph), 5.81 (m, 2H, COOC$\underline{H}$Ph), 5.12-4.90 (m, 6H, OH), 4.34 (m, 3H, C$\underline{H}_2$ OH), 3.92-3.77 (m, 8H, COOC$\underline{H}_2$ CHPh), 3.85 (m, 3H, C$\underline{H}_2$ OH)

EXAMPLE 7

In a reaction vessel equipped with a stirrer, a condenser, a heater, a nitrogen introduction tube, a thermostat and an alkali trap, Intermediate product 1 (100 parts), thionyl chloride (SO$_2$Cl) (300 parts) and N,N-dimethylformamide (DMF) (2 parts) were placed and stirred under a nitrogen atmosphere, and then allowed to react for 5 hours while the reaction temperature was kept at 60° C. to obtain Intermediate product 3.

After the reaction was completed, excess thionyl chloride was distilled off and then the solution was evaporated and dried to leave Intermediate product 3. Subsequently, 5-aminoisophthalic acid (171 parts), N,N-dimethyl-4-aminopyridine (DMAP) (12 parts) and N,N-dimethylacetamide (DMAc) (2500 parts) were added to Intermediate product 3. The mixture was stirred, and then allowed to react for 12 hours while the reaction temperature was kept at 25° C. After the reaction was completed, the reaction solution was poured into pure water (50000 parts) to form precipitates, which was then collected by filtration and dried in vacuum at 50° C. to obtain 228 parts (95%) of Product 7.

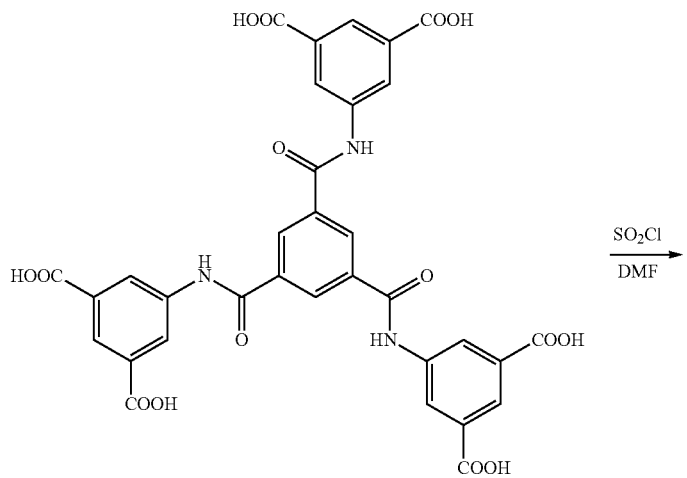

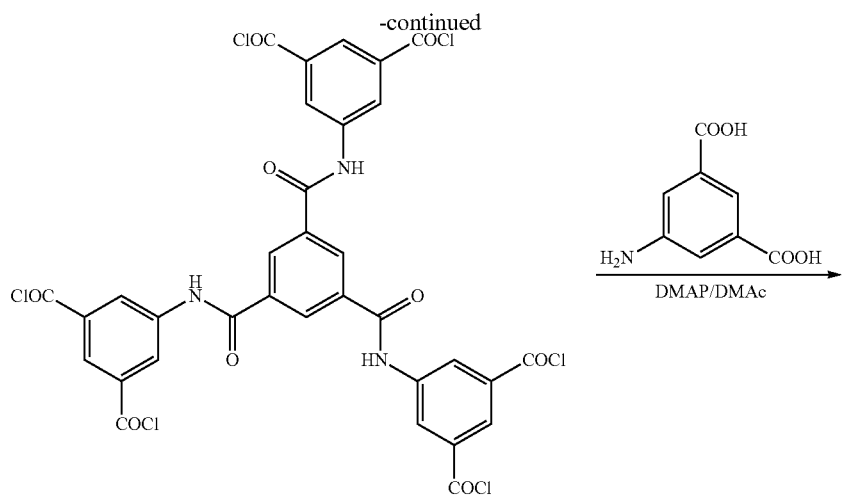

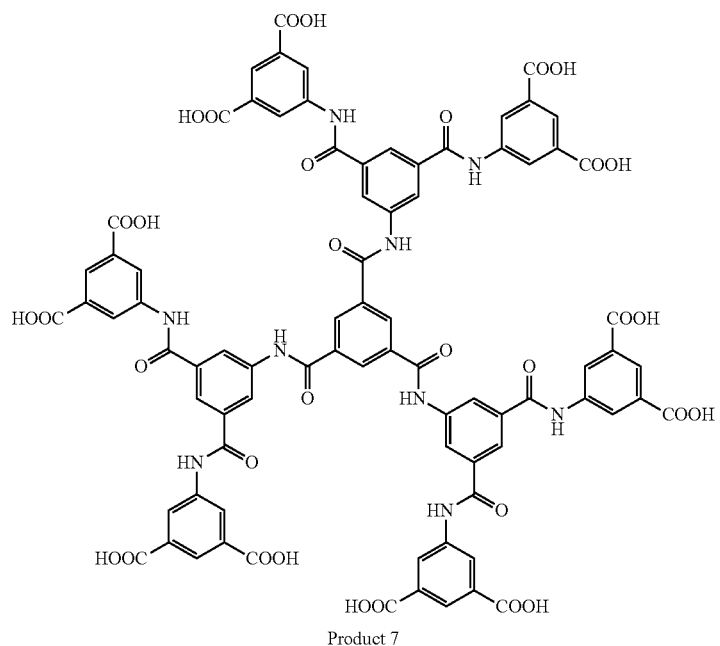

Product 7

Spectrum Data of Product 7

$^1$H-NMR (DMSO-d6): 12.01 (s, 6H, CONH), 11.50 (s, 3H, CONH), 8.85 (s, 3H, ArH), 8.81 (s, 9H, ArH), 8.71 (d, 12H, $J$=1.2 Hz, ArH), 8.28 (t, 6H, $J$=1.2 Hz, ArH)

EXAMPLE 8

In a reaction vessel equipped with a stirrer, a condenser, a heater, a nitrogen introduction tube and a thermostat, Product 7 (100 parts), styrene oxide (260 parts), tetrabutylammonium bromide (TBAB) (10 parts) and N,N-dimethylacetamide (DMAc) (2000 parts) were placed and stirred under a nitrogen atmosphere, and then allowed to react for 24 hours while the reaction temperature was kept at 80° C.

After the reaction solution was cooled to room temperature, ethyl acetate (2000 parts) and pure water (2000 parts) were added therein. The ethyl acetate solution was extracted, and thereafter saturated sodium bicarbonate aqueous solution (2000 parts) was added therein. The ethyl acetate solution was again extracted and dried with magnesium sulfate (100 parts). After the solvent was distilled off, the residue was subjected to silica-gel column chromatography with ethyl acetate (3)-hexane (1) as the eluent so as to separate and purify the product, which was then dried in vacuum at 50° C. to obtain 119 parts of Product 8 (yield: 64%).

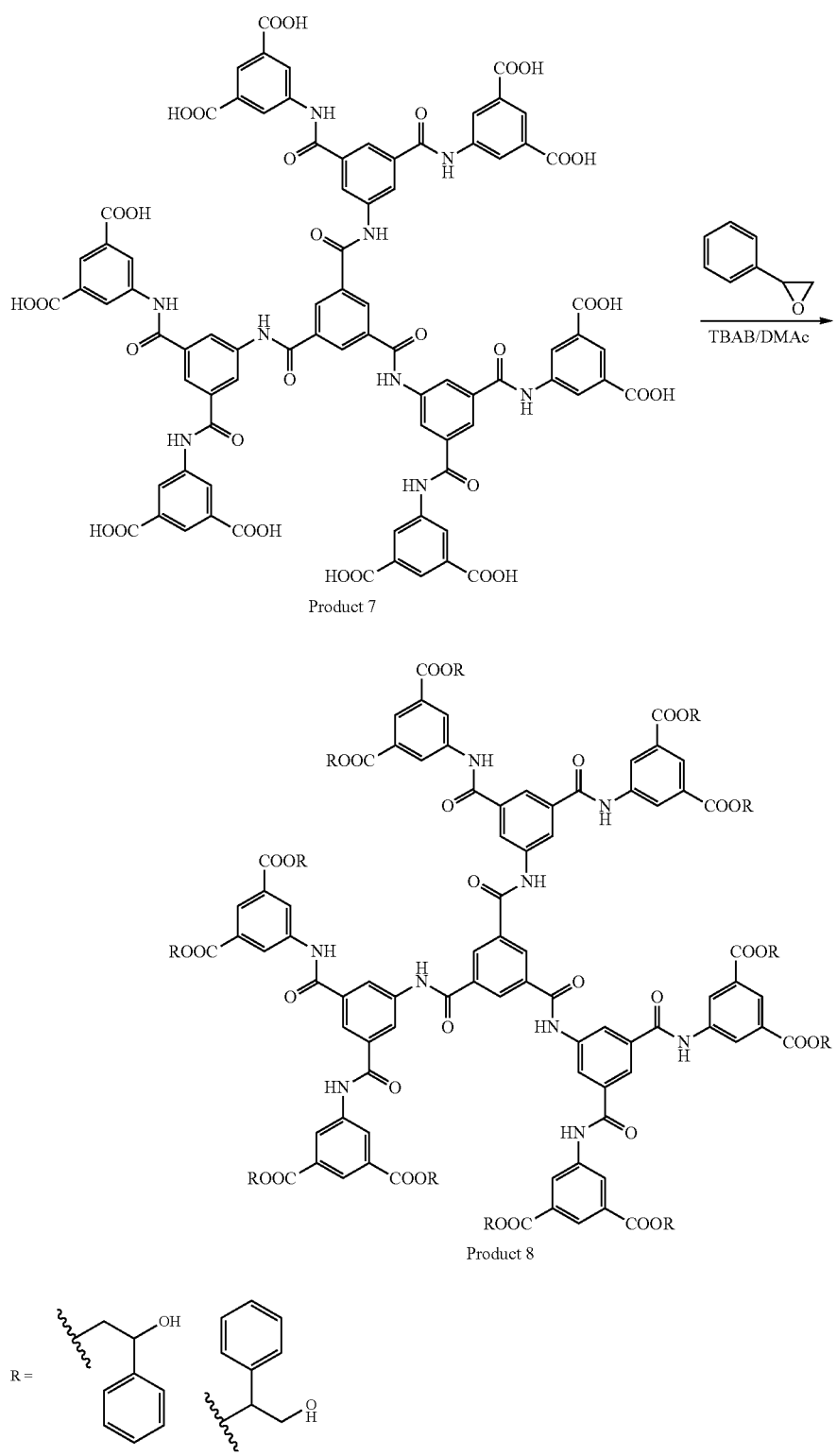

Product 7

Product 8

R =

Spectrum Data of Product 8

$^1$H-NMR (DMSO-d6): 12.00 (m, 6H, CONH), 11.51 (m, 3H, CONH), 8.86 (m, 3H, ArH), 8.84 (m, 9H, ArH), 8.71 (m, 12H, ArH), 8.28 (m, 6H, ArH), 7.34 (m, 60H, ArH), 6.04 (m, 4H, COOC$\underline{H}$Ph), 5.84-5.28 (m, 12H, OH), 5.00 (m, 10H, C$\underline{H}$OH), 4.44 (m, 16H, COOC$\underline{H_2}$CH), 3.84 (m, 6H, C$\underline{H_2}$OH)

COMPARATIVE EXAMPLE 1

In a reaction vessel equipped with a stirrer, a condenser, a heater and a thermostat, tetrahydrofuran (THF) (100 parts), propylene glycol monomethyl ether acetate (PGMEA) (227 parts), 1,3,4,6-tetrakis(methoxymethyl)glycoluril (MX-270

[trademark], manufactured by Sanwa Chemical Co., Ltd.) (84.20 parts), 2,5-dimethylphenol (8.42 parts) and 3-iodophenol (29.19 parts) were placed and heated to 80° C. When the temperature reached 80° C., p-toluenesulfonic acid monohydrate (PTSA, 0.8420 part) was added. Thereafter, the reaction mixture was kept at 80° C. for 5 hours to react.

After cooled to room temperature, the reaction solution was poured into pure water (6000 parts) to form precipitates, which was collected by filtration. The precipitates were then dissolved in 150 g of acetone, and the solution was poured into pure water (3000 parts) to form precipitates, which was again collected by filtration and dried in vacuum at 50° C. to obtain Product R1 in a polymer state in a yield of 39%. The molecular weight of the product was measured by GPC (THF) to find: weight average molecular weight Mw=3046 Da, number average molecular weight Mn=1263 Da, and polydispersion index PDI=2.41.

COMPARATIVE EXAMPLE 2

The procedure of Comparative example 1 was repeated except for changing the reaction time into 8 hours, to obtain Product R2. The molecular weight of the product was measured by GPC (THF) to find:
weight average molecular weight Mw=16035 Da,
number average molecular weight Mn=6051 Da, and
polydispersion index PDI=2.65.

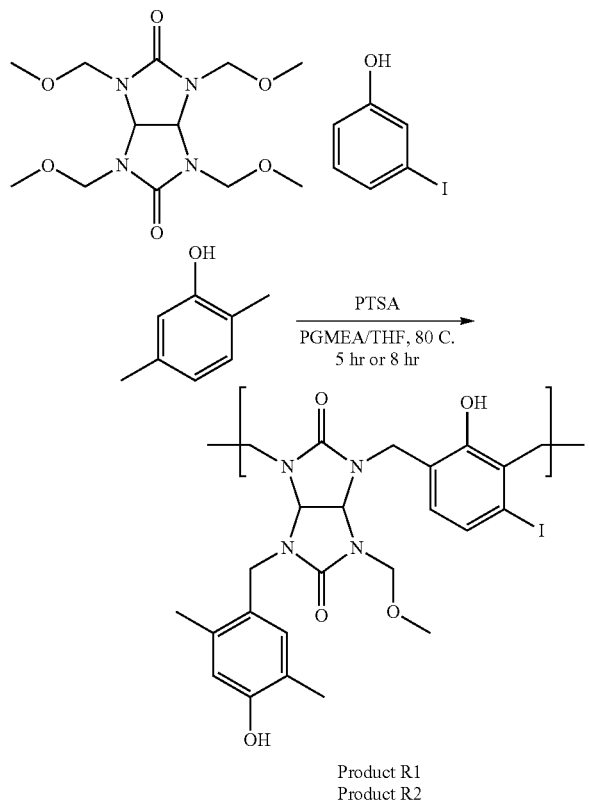

Product R1
Product R2

APPLICATION EXAMPLE 1 (Ap.1)

Product 1 (1.26 parts), 1,3,4,6-tetrakis(methoxymethyl)-glycoluril (MX-270 [trademark], manufactured by Sanwa Chemical Co., Ltd.) (1.26 parts) as a crosslinking agent, 10-camphorsulfonic acid (CSA) (0.0173 part) as a thermal acid generating agent, triethylamine (TEA) (0.008 part) and propylene glycol monomethyl ether acetate (136.162 parts) as a solvent were mixed and stirred for 30 minutes at room temperature, to prepare a composition for forming resist underlayer film.

The prepared composition was spin-coated on a silicon microchip wafer, and heated in vacuum on a hot-pate at 200° C. for 60 seconds so as to cause crosslinking. Thus, an underlayer film was formed.

APPLICATION EXAMPLES 2 TO 10 (Ap.2-10) AND COMPARATIVE APPLICATION EXAMPLES 1 AND 2 (Com.Ap.1-2)

The procedure of Application example 1 was repeated except for changing the components into those shown in Table 1, to prepare compositions of Application examples 2 to 10 and Comparative application examples 1 and 2.

The prepared compositions were evaluated in the following manners.
Evaluation of Durability Against Solvents Each underlayer film was subjected to thinning tests by use of ethyl lactate, propylene glycol monomethyl ether acetate and propylene glycol monomethyl ether as the solvents, and thereby was classified into the following grades:
A: the film was insoluble in all of ethyl lactate, propylene glycol monomethyl ether acetate and propylene glycol monomethyl ether, and hence was practically excellent;
B: the film was slightly soluble in any one of ethyl lactate, propylene glycol monomethyl ether acetate and propylene glycol monomethyl ether, but was practically usable without problems; and
C: the film was soluble in all or anyone of ethyl lactate, propylene glycol monomethyl ether acetate and propylene glycol monomethyl ether, and hence was practically unusable.
Evaluation of Density Inhomogeneity The density of each underlayer film was measured at various depths according to X-ray reflection by means of ATX-G X-ray diffraction workstation ([trademark], manufactured by Rigaku Corporation), to evaluate density inhomogeneity. As a result, for example, the film of Application example 1 was found to have densities of 1.36 g/cm$^3$ near the top, 1.34 g/cm$^3$ at the middle and 1.33 g/cm$^3$ near the bottom, and the σ (inhomogeneity) value of those measured densities was found to be 0.015.
Evaluation of Thermal Expansion Coefficient The thickness change of each underlayer film was measured by means of a variable-incident angle rotating compensator type high-speed spectroscopic ellipsometer M-2000V ([trademark], manufactured by J. A. Woollam Co.) while the film temperature was being changed, and thereby the rate of the change was evaluated as a thermal expansion coefficient. As a result, for example, the film of Application example 1 was found to have a thermal expansion coefficient of $7.9 \times 10^{-6}$ ° C.$^{-1}$.
Evaluation of Dry Etching Rate Ratio The dry etching rate of each underlayer film was measured with a RIE system ES401 ([trademark], manufactured by Nippon Scientific Co., Ltd.) under the condition that oxygen was adopted as the dry etching gas. Meanwhile, a resist solution (SEVR-162 [trademark], manufactured by Sumitomo Chemical Co., Ltd.) was cast on a silicon wafer by means of a spinner, to form a resist film. The dry etching rate of the resist film was then measured with a RIE system ES401 ([trademark], manufactured by Nippon Scientific Co., Ltd.)

under the condition that oxygen was adopted as the dry etching gas. The above dry etching rate of each underlayer film was then compared with that of the resist film formed from the resist solution manufactured by Sumitomo Chemical Co., Ltd. For example, the ratio of the dry etching rate of the underlayer film of Application example 1 to that of the above resist film was calculated and found to be 1.81.

EUV Exposure Test

The composition for forming resist underlayer film according to the present invention prepared in Application example 1 was spin-coated on a silicon wafer and heated at 200° C. for 1 minute, to form a resist underlayer film. On the formed resist underlayer film, a resist solution (SEVR-162 [trademark], manufactured by Sumitomo Chemical Co., Ltd.) was spin-coated, heated and then subjected to exposure by means of EUV exposure apparatus (Albany MET) under the conditions of NA=0.36 and σ=0.93. The exposed resist was heated after the exposure, cooled to room temperature on a cooling plate, developed and rinsed to form a resist pattern on the silicon wafer.

EB Exposure Test

The composition for forming resist underlayer film according to the present invention prepared in Application example 1 was spin-coated on a silicon wafer and heated at 200° C. for 1 minute, to form a resist underlayer film. On the formed resist underlayer film, an EB-oriented resist solution was spin-coated, heated and then subjected to exposure by means of EB exposure apparatus. The exposed resist was heated after the exposure, cooled to room temperature on a cooling plate, developed and rinsed to form a resist pattern on the silicon wafer.

The EB exposure as well as the above EUV exposure was evaluated on sensitivity, on depth of focus, on exposure latitude and on LWR.

Evaluation of Pattern Cross-Sectional Shape

The cross-sectional shape of each pattern was observed by means of electron microscope, and thereby the pattern was classified into the following grades:

A: the photoresist pattern had a rectangular-shaped side surface perpendicular to the substrate surface;
B: the photoresist pattern had a side surface not perpendicular but slightly inclined to the substrate surface, but was practically usable without problems; and
C: the photoresist pattern had a footing-shaped to the substrate surface.

Evaluation of Sensitivity (in Terms of mJ/cm$^2$)

The optimal amount of exposure (mJ/cm$^2$) was defined as an exposure amount in which a one-to-one line and space pattern having a line width of 30 nm was formed through a mask of 30 nm-dimension one-to-one line and space, and was regarded as "sensitivity".

Evaluation of Depth of Focus (DOF) (in Terms of μm)

The depth of focus (DOF) was defined as a focus fluctuation range where the pattern formed through a 30-nm one-to-one line and space mask in the optimal amount of exposure had a dimension within ±10% of the designed mask dimension.

Evaluation of Exposure (EL) (in Terms of %)

The pattern formed through a 30-nm one-to-one line and space mask in the optimal amount of exposure was observed from the above, and the pattern width thereof was measured at random 100 points. The 3-σ value (inhomogeneity) of the measured values was regarded as the critical dimension uniformity (CDU).

Evaluation of LWR (in Terms of nm)

The pattern formed through a 30-nm one-to-one line and space mask in the optimal amount of exposure was observed from the above, and the pattern width thereof was measured at random 100 points. The 3-σ value (inhomogeneity) of the measured values was regarded as LWR.

The results were shown in Tables 1 and 2. As evident from those results, the composition for forming resist underlayer film according to the present invention enables to form an underlayer film excellent in durability against solvents, in inhomogeneity of density, in thermal expansion coefficient and in etching rate ratio. Further, it was also verified that the composition of the present invention can form a pattern excellent in cross-sectional shape, in sensitivity, in LWR, in DOF and in EL. In the above examples, the compositions were evaluated in the case where the pattern shape was of line-and-space. However, even if the pattern was in other shapes such as contact hole, the composition for forming resist underlayer film according to the present invention can achieve excellent characteristics.

TABLE 1

| | Composition | | | | | | |
|---|---|---|---|---|---|---|---|
| | Dendrimer compound or polymer | Crosslinking agent | Thermal acid generating agent | Durability against solvents | Density inhomogeneity | Thermal expansion coefficient (° C.$^{-1}$) | Etching rate ratio |
| Ap. 1 | Example 1 | MX-270 | CSA/TEA | A | 0.015 | $7.9 \times 10^{-6}$ | 1.81 |
| Ap. 2 | Example 2 | MX-270 | CSA/TEA | A | 0.018 | $8.4 \times 10^{-6}$ | 1.78 |
| Ap. 3 | Example 3 | MX-270 | CSA/TEA | A | 0.016 | $7.7 \times 10^{-6}$ | 1.61 |
| Ap. 4 | Example 4 | MX-270 | CSA/TEA | A | 0.020 | $7.1 \times 10^{-6}$ | 1.79 |
| Ap. 5 | Example 5 | MX-270 | CSA/TEA | A | 0.019 | $6.9 \times 10^{-6}$ | 1.59 |
| Ap. 6 | Example 6 | MX-270 | CSA/TEA | A | 0.024 | $6.6 \times 10^{-6}$ | 1.54 |
| Ap. 7 | Example 8 | MX-270 | CSA/TEA | A | 0.047 | $7.9 \times 10^{-6}$ | 1.79 |
| Ap. 8 | Example 1 | MW-30HM | CSA/TEA | A | 0.021 | $7.9 \times 10^{-6}$ | 1.81 |
| Ap. 9 | Example 1 | MX-270 | PTSA/TEA | A | 0.016 | $7.8 \times 10^{-6}$ | 1.79 |
| Ap. 10 | Example 1 | MX-270 | Nf/TEA | A | 0.017 | $7.6 \times 10^{-6}$ | 1.77 |
| Com. Ap. 1 | Com. Ex. 1 | — | CSA/TEA | A | 0.119 | $10.6 \times 10^{-8}$ | 1.43 |
| Com. Ap. 2 | Com. Ex. 2 | — | CSA/TEA | A | 0.121 | $10.0 \times 10^{-8}$ | 1.41 |

MX-270: 1,3,4,6-tetrakis(methoxymethyl)glycoluril
MW-30HM: hexakis(methoxymethyl)-1,3,5-triazine-2,4,6-triamine
CSA/TEA: camphorsulfonic acid/triethylamine
PTSA/TEA: p-toluenesulfonic acid/triethylamine
Nf/TEA: 1,1,2,2,3,3,4,4,4-nanofluorobutane-1-sulfonic acid/triethylamine

TABLE 2

| | Application for EUV-oriented resist | | | | | Application for EB-oriented resist | | | | |
|---|---|---|---|---|---|---|---|---|---|---|
| | Pattern cross-sectional shape | Sensitivity (mJ/cm$^2$) | LWR (nm) | DOF (μm) | EL (%) | Pattern cross-sectional shape | Sensitivity (mJ/cm$^2$) | LWR (nm) | DOF (μm) | EL (%) |
| Ap. 1 | A | 36.0 | 3.54 | 0.35 | 18.8 | A | 36.0 | 3.78 | 0.30 | 17.5 |
| Ap. 2 | A | 33.5 | 3.49 | 0.30 | 17.6 | A | 35.0 | 3.69 | 0.25 | 16.7 |
| Ap. 3 | A | 36.5 | 3.50 | 0.35 | 18.0 | A | 36.0 | 3.72 | 0.30 | 17.0 |
| Ap. 4 | A | 34.5 | 3.52 | 0.35 | 18.6 | A | 35.5 | 3.65 | 0.25 | 17.2 |
| Ap. 5 | A | 33.0 | 3.34 | 0.30 | 17.9 | A | 35.0 | 3.64 | 0.30 | 17.2 |
| Ap. 6 | A | 30.5 | 3.29 | 0.30 | 16.5 | A | 34.5 | 3.55 | 0.30 | 15.2 |
| Ap. 7 | B | 36.0 | 3.89 | 0.20 | 16.9 | A | 37.0 | 4.10 | 0.15 | 15.3 |
| Ap. 8 | A | 36.0 | 3.53 | 0.35 | 18.7 | A | 36.0 | 3.75 | 0.30 | 17.3 |
| Ap. 9 | A | 35.5 | 3.52 | 0.35 | 18.3 | A | 36.0 | 3.72 | 0.30 | 17.0 |
| Ap. 10 | A | 35.0 | 3.51 | 0.35 | 18.1 | A | 35.5 | 3.69 | 0.30 | 16.6 |
| Com. Ap. 1 | B | 36.0 | 5.23 | 0.20 | 13.5 | B | 38.0 | 4.98 | 0.15 | 15.3 |
| Com. Ap. 2 | C | 35.5 | 5.29 | 0.20 | 13.0 | C | 37.5 | 5.10 | 0.15 | 14.9 |

The invention claimed is:

1. A dendrimer compound represented by the following formula (1):

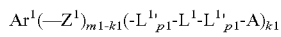  (1)

in which
Ar$^1$ is an aromatic skeleton selected from the group consisting of benzene skeleton, naphthalene skeleton and anthracene skeleton;
each Z$^1$ is hydrogen, a hydrocarbon group of 1 to 3 carbon atoms or a halogen provided that the plural Z$^1$s may be the same or different from each other;
each L$^1$ is amide bond or ester bond provided that the plural L$^1$s may be the same or different from each other;
each L$^{1\prime}$ is a divalent linking group selected from the group consisting of a hydrocarbon chain having 1 to 3 carbon atoms, an oxygen-containing hydrocarbon chain having 1 to 3 carbon atoms, and a sulfur-containing hydrocarbon chain having 1 to 3 carbon atoms, and may be a straight chain or a branched chain provided that the plural L$^{1\prime}$'s may be the same or different from each other;
m1 is 6 if Ar$^1$ is benzene skeleton, 8 if Ar$^1$ is naphthalene skeleton or 10 if Ar$^1$ is anthracene skeleton;
k1 is a number of 2 or more but not more than m1;
each p1 is 0 or 1 provided that the plural p1s may be the same or different from each other; and
A is a group represented by the following formula (2):

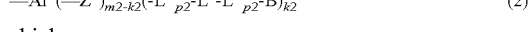  (2)

in which
Ar$^2$ is an aromatic skeleton selected from the group consisting of benzene skeleton, naphthalene skeleton and anthracene skeleton;
each Z$^2$ is hydrogen, a hydrocarbon group of 1 to 3 carbon atoms or a halogen provided that the plural Z$^2$s may be the same or different from each other;
each L$^2$ is amide bond or ester bond provided that the plural L$^2$s may be the same or different from each other;
each L$^{2\prime}$ is a divalent linking group selected from the group consisting of a hydrocarbon chain having 1 to 4 carbon atoms, an oxygen-containing hydrocarbon chain having 1 to 4 carbon atoms, and a sulfur-containing hydrocarbon chain having 1 to 4 carbon atoms, and may be a straight chain or a branched chain provided that the plural L$^{2\prime}$'s may be the same or different from each other;
m2 is 5 if Ar$^2$ is benzene skeleton, 7 if Ar$^2$ is naphthalene skeleton or 9 if Ar$^2$ is anthracene skeleton;
k2 is a number of 1 or more but not more than m2;
each p2 is 0 or 1 provided that the plural p2s may be the same or different from each other; and
B is a group represented by the above formula (2) or by the following formula (3A) or (3B):

  (3A)

  (3B)

in which
Ar$^3$ is an aromatic skeleton selected from the group consisting of benzene skeleton, naphthalene skeleton and anthracene skeleton;
each Z$^3$ is a group selected from the group consisting of hydrogen, a hydrocarbon group of 1 to 4 carbon atoms, a halogen, carboxyl group and ester group, provided that the plural Z$^3$s may be the same or different from each other;
m3 is 5 if Ar$^3$ is benzene skeleton, 7 if Ar$^3$ is naphthalene skeleton or 9 if Ar$^3$ is anthracene skeleton; and
R$^3$ is a hydrocarbon group of 1 to 4 carbon atoms which may be substituted with a halogen;
and further wherein the dendrimer compound is further selected from the group consisting of a), b), c) d) e), f) and g;
a) the dendrimer compound, wherein all of said p1s are 0, the number of generation is 10 or less, said Ar$^1$ is benzene skeleton, K1 is 3 and the halogens in Z$^3$ and R$^3$ are selected from the group consisting of fluorine, chlorine, bromine, and iodine;
b) the dendrimer compound, wherein all of said p1s are 0, the number of generation is 10 or less, said Ar$^1$ is benzene skeleton, K1 is 3 and the halogens in Z$^3$ and R$^3$ are selected from the group consisting of fluorine and iodine;
c) the dendrimer compound wherein all of said p1s are 0, the number of generation is 10 or less, said Ar$^1$ is benzene skeleton, K1 is 3, Ar$^2$ is benzene skeleton, K2 is 3 or 2, Ar$^3$ is a benzene skeleton, and the halogens in Z$^3$ and R$^3$ are selected from the group consisting of fluorine, chlorine, bromine, and iodine;
d) the dendrimer compound wherein all of said p1s are 0, the number of generation is 10 or less, said Ar$^1$ is benzene skeleton, K1 is 3, $Ar^2$ is benzene skeleton, K2 is 3 or 2, $Ar^3$ is a benzene skeleton, and the halogens in $Z^3$ and $R^3$ are selected from the group consisting of fluorine and iodine;

e) the dendrimer compound wherein all of said p1s are 0, the number of generation is 6 or less, said $Ar^1$ is benzene skeleton, K1 is 3, $Ar^2$ is benzene skeleton, K2 is 3 or 2, $Ar^3$ is a benzene skeleton, and the halogens in $Z^3$ and $R^3$ are selected from the group consisting of fluorine and iodine;

f) the dendrimer compound wherein all of said p1s are 0, the number of generation is 10 or less, said $Ar^1$ is benzene skeleton, K1 is 3, $Ar^2$ is benzene skeleton, K2 is 3 or 2, and $Z^2$ is fluorine, chlorine, bromine, or iodine; and g) the dendrimer compound wherein all of said p1s are 0, the number of generation is 10 or less, said $Ar^1$ is benzene skeleton, K1 is 3, $Ar^2$ is benzene skeleton, K2 is 3 or 2, and $Z^2$ is iodine or fluorine.

2. A composition for forming a resist underlayer film comprising the dendrimer compound according to claim 1, a crosslinking agent, a thermal acid generating agent, and a solvent.

3. An underlayer film formed by coating on a substrate and then heating the composition for forming resist underlayer film according to claim 2.

4. A pattern formation method comprising the steps of
coating on a semiconductor substrate and then baking the composition for forming resist underlayer film according to claim 2, to form an underlayer film,
forming a photoresist layer on said underlayer film,
exposing to light said semiconductor substrate covered with said underlayer film and said photoresist layer, and
developing said exposed photoresist layer with a developer.

5. The pattern formation method according to claim 4, wherein said exposing step is carried out by use of light in a wavelength range from the wavelength of electron beams to that of KrF excimer laser.

* * * * *